United States Patent
Ku (10) Patent No.: US 7,679,969 B2
(45) Date of Patent: Mar. 16, 2010

(54) SEMICONDUCTOR MEMORY DEVICE UTILIZING DATA MASK SIGNAL FOR SHARING AN INPUT/OUTPUT CHANNEL IN A TEST MODE AND DATA OUTPUT METHOD USING THE SAME

(75) Inventor: Kie Bong Ku, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 73 days.

(21) Appl. No.: 12/141,169

(22) Filed: Jun. 18, 2008

(65) Prior Publication Data
US 2009/0207677 A1    Aug. 20, 2009

(30) Foreign Application Priority Data
Feb. 14, 2008    (KR) .................... 10-2008-0013674

(51) Int. Cl.
*G11C 7/10*    (2006.01)
(52) U.S. Cl. .......................... 365/189.03; 365/189.08; 365/189.15; 365/201; 365/194; 365/233.12
(58) Field of Classification Search ................. 365/201, 365/189.02, 189.03, 189.08, 189.15, 194, 365/233.12
See application file for complete search history.

(56) References Cited

U.S. PATENT DOCUMENTS 6,141,273 A * 10/2000 Ku et al. ..................... 365/201
2008/0170461 A1 * 7/2008 Ku ........................ 365/233.17

FOREIGN PATENT DOCUMENTS

KR    10-0293137 B1    3/2001
KR    1020080001604 A    1/2008

* cited by examiner

*Primary Examiner*—Andrew Q Tran
(74) *Attorney, Agent, or Firm*—Ladas & Parry LLP

(57) ABSTRACT

A semiconductor device receives a first data mask signal and a second data mask signal. A data mask control unit outputs a data mask control signal by combining a test mode signal with the first data mask signal. A data clock output unit receives a delay locked loop (DLL) clock and outputs a data clock in response to the data mask control signal. A column address enable (YAE) control signal generating unit generates a column address enable control signal to control the enablement of a column address enable signal. The column address enable control signal generating unit generates the column address enable control signal by combining the test mode signal with the second data mask signal.

24 Claims, 4 Drawing Sheets

SEMICONDUCTOR MEMORY DEVICE UTILIZING DATA MASK SIGNAL FOR SHARING AN INPUT/OUTPUT CHANNEL IN A TEST MODE AND DATA OUTPUT METHOD USING THE SAME

CROSS-REFERENCE TO RELATED APPLICATIONS

The present application claims priority to Korean patent application number 10-2008-0013674 filed on Feb. 14, 2008, which is incorporated herein by reference in its entirety.

BACKGROUND OF THE INVENTION

The present invention relates to a semiconductor device, and more particularly to a semiconductor device and a data outputting method using the semiconductor device which reduce test time by using a data mask.

In a semiconductor memory device, such as DRAM, the read operation and write operation of data must be performed correctly. Thus, it is important to prevent a fail cell from occurring in a chip. However, with developments in semiconductor technology, semiconductor devices have become highly integrated. Accordingly, the number of memory cells integrated on a single chip has gradually increased with improvements in semiconductor technology. While the production process of semiconductor devices has improved, the possibility of a fail cell within the chip is still relatively high.

If testing on such a fail cell is incorrectly performed, it becomes impossible to secure the reliability of the semiconductor memory device.

When testing to secure the reliability of a semiconductor memory device, if a test is performed per a unit of one memory cell, determining whether each memory cell has passed or failed takes an extremely large amount of time when a highly-integrated semiconductor memory device is tested, which in turn results in higher cost.

Accordingly, it is apparent that it is highly desirable to reduce the amount of test time. A multi-bit test method is one method for reducing this test time.

The multi-bit test method accesses data simultaneously, and accordingly test time can be reduced. However, a multi-bit test method tests data by compressing it, resulting in disadvantages. One such disadvantage is that the multi-bit test method cannot decrease screenability, and another is that the multi-bit test method cannot properly reflect relativity due to a difference between data paths and/or power noise.

In particular, when using the multi-bit test method, the test equipment must secure the same number of pins as that of the devices, resulting in increased cost. That is, in order for a high-speed test to be performed, the test equipment must be equipped with the same number of channels as that of the devices to be tested, and enormous cost is associated with such equipment.

A method used to address such a problem is sharing an input/output channel by using a data mask.

For example, when operating in X16 mode, it is possible to test the semiconductor memory device operating in X16 even if only 8 channels are equipped. This is made possible by dividing the data output pad into an upper data output pad DQ<0:7> and a lower data output pad DQ<8:15> and masking the lower data output pad DQ<0:7> and the upper data output pad DQ<8:15> by turns.

While it is possible to reduce cost by reducing the number of channels by sharing the channels through the data mask, there is a problem in that the reliability of the test decreases.

Figure 1:
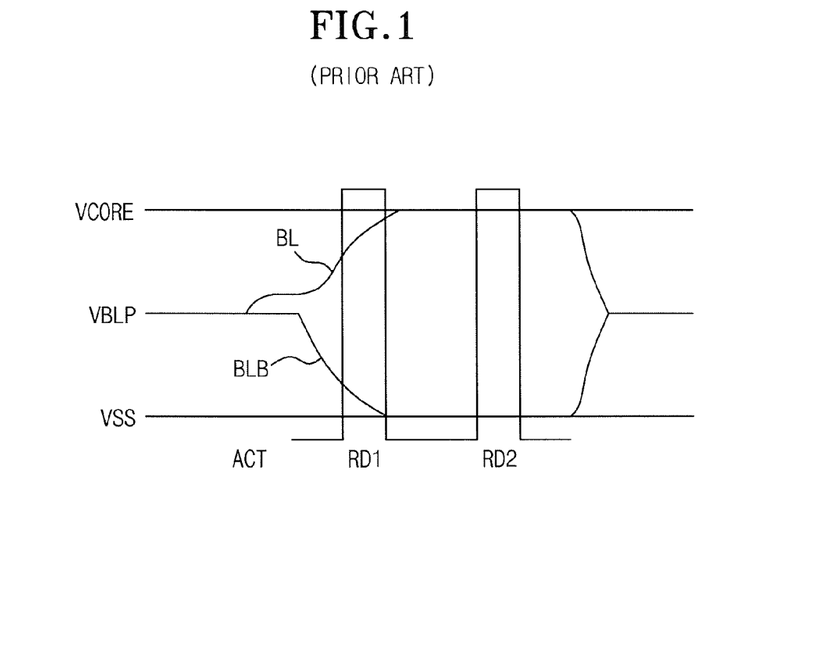
FIG. 1 is an operational waveform diagram illustrating the operation of a core portion of a conventional memory device.

FIG. 1 shows the operational waveform of a core portion of a conventional semiconductor device for illustrating problems in the reliability of a conventional test.

Referring to FIG. 1, a bit line pair BL, BLB is precharged at a certain level VBLP. Charge sharing occurs when an active command ACT is applied, so that the bit line pair has a difference in potential of a certain level. When the difference in potential is generated, the difference is amplified using a sense amplifier, and thus the bit line BL is boosted to the core voltage VCORE level and the inverted bit line BLB is lowered to the ground voltage VSS level.

In order to test the data using the above-mentioned channel sharing method, read commands must be applied twice. That is, when the active command ACT is applied during test mode, the first read command RD1 is applied, and then, after a prescribed period of time passes, a second read command RD2 is applied.

The difference in potential between the bit line pair BL, BLB is small at the time point when the first read command RD1 is applied, while the difference between the bit line pair BL, BLB is sufficiently large at the time point when the second read command RD2 is applied. Accordingly, a problem occurs, in that data determined to be a failure during the first read command RD1 can be determined passing during the second read command RD2. That is, the screenability of the data decreases according to the just described simple channel sharing method.

SUMMARY OF THE INVENTION

The present invention provides a semiconductor device and data outputting method using the semiconductor device capable of increasing screenability by preventing data access to a second read command when the semiconductor device is in test mode.

The semiconductor device according to one aspect of the present invention comprises a data mask control unit outputting a data mask control signal by combining a test mode signal with a first data mask signal; a data clock output unit receiving a delay locked loop (DLL) clock and outputting a data clock in response to the data mask control signal; and a YAE control signal generating unit generating a column address enable control signal that controls a column address enable signal, the YAE control signal generating unit generating the column address enable control signal by combining the test mode signal with a second mask signal.

Preferably, the semiconductor device further comprises a YAE generating unit disabling the column address enable signal when the column address enable control signal is enabled. The first data mask signal is a lower data mask signal and the second data mask signal is an upper data mask signal.

The data mask control unit outputs a first mask control signal that causes the output of the first data pad to be interrupted when the test mode signal and the first data mask signal are enabled; and a second data mask control signal that causes an output of the second data pad to be interrupted when the test mode signal is enabled and the first data mask signal is disabled.

The first data pad is a lower data pad outputting a lower bit data to outside of the memory and the second data pad is an upper data pad outputting an upper bit data to outside of the memory.

The data clock output unit outputs a first data clock which is disabled when the first data mask control signal is enabled; and a second data clock which is disabled when the second data mask control signal is enabled.

The first data clock is a lower data clock controlling an output from the lower data pad, and the second data clock is an upper data clock controlling an output from the upper data pad.

The second data mask signal is enabled when a second read command is applied after the test mode signal is enabled.

The column address enable control signal is enabled when the second data mask signal is enabled.

A semiconductor device according to another aspect of the present invention comprises multiple first and second data pads that read cell data by causing a column address enable signal to be activated if a data read command is applied, the read data is output outside of the memory and the output of the data is interrupted in response to a data mask signal; a data mask control unit controls the outputs of the first and second data pads simultaneously in response to a first data mask signal; and a YAE control signal generating unit generates a signal that controls the generation of the column address enable signal in response to a second data mask signal.

Preferably, the data mask control unit interrupts an output from the first data pad and outputs the data via the second data pad when the first data mask signal is enabled.

The data mask control unit outputs the data via the first data pad and interrupts an output from the second data pad when the first data mask signal is disabled.

The YAE control signal generating unit controls such that the column address enable signal is disabled when the second data mask signal is enabled.

The second data mask signal is enabled when a second read command is applied after the test mode is entered.

The YAE control signal generating unit generates a control signal which is enabled when the second data mask signal is enabled.

The first data mask signal is a lower data mask signal and the second data mask signal is an upper data mask signal.

A data output method of a semiconductor device according to another aspect of the present invention comprises the steps of: applying a first read command after a test mode is entered into; reading data in a memory cell in accordance with the first read command to transmit the data to multiple first and second data output pads; enabling a first data mask signal to cause the first data output pads to be interrupted when the first read command is applied; disabling a column address enabled signal in response to a second data mask signal when the second read command is applied; and disabling the first data mask signal to cause the second data output pads to be interrupted.

Preferably, the method further comprises the step of outputting the transmitted data via the second data output pad after interrupting the first data output pad.

The method further comprises the step of outputting the transmitted data via the first data output pad after interrupting the second data output pad.

The first data output pad is a lower data output pad and the second data output pad is an upper data output pad.

The first data mask signal is a lower data mask signal and the second data mask signal is an upper data mask signal.

The second data mask signal is disabled when the first read command is applied and enabled when the second read command is applied.

The present invention, improves test speed, and thereby yield, by increasing the number of chips which can be tested by sharing input/output pads in the test mode.

Further, according to the present invention, it is possible to improve screenability to decide pass/fail upon testing by disabling the data access according to the second read command using any one of the lower data mask signal or the upper data mask signal.

DESCRIPTION OF SPECIFIC EMBODIMENTS

The present invention discloses an apparatus and a method using one of a lower data mask signal and an upper data mask signal to control the output of data, and using the remaining data mask signal to control a column address enable signal.

Hereinafter, preferred embodiments of the present invention will be described in detail with reference to the accompanying drawings.

Figure 2:
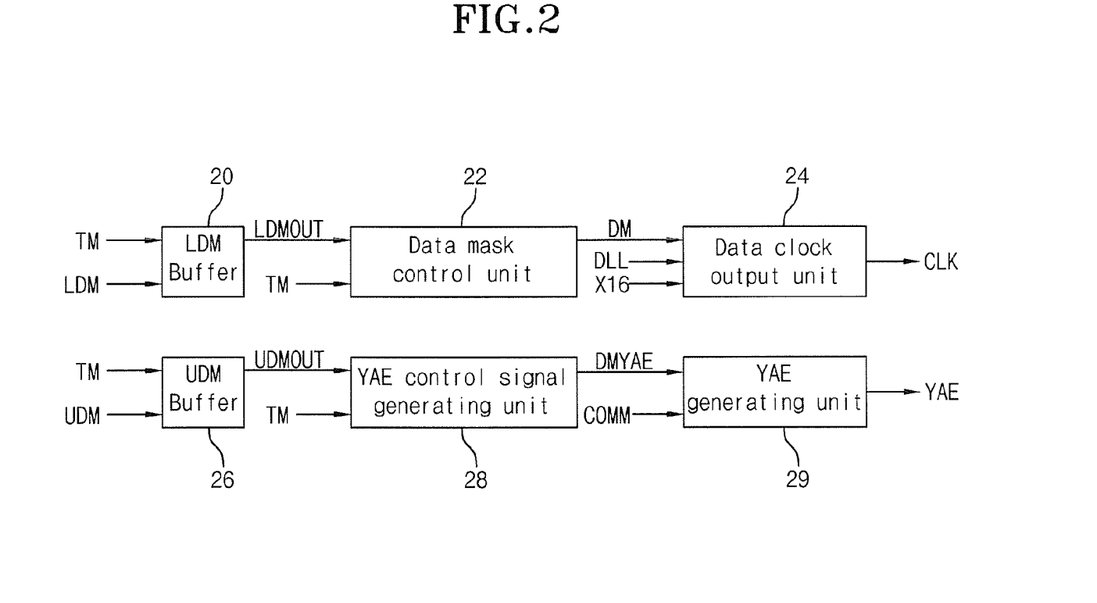
FIG. 2 is a block diagram showing a semiconductor device according to an embodiment of the present invention.

FIG. 2 is a block diagram showing a semiconductor device according to an embodiment of the present invention.

Referring to FIG. 2, the semiconductor device according to an embodiment of the present invention comprises: a lower data mask buffer 20, a data mask control unit 22, a data clock output unit 24, an upper data mask buffer 26, a column address enable (YAE) control signal generating unit 28, and a YAE generating unit 29.

The lower data mask buffer 20 receives a test mode signal TM and a lower data mask signal LDM. When the test mode signal TM is at a high level (enabled), the lower data mask buffer 20 outputs a lower data mask buffering signal LDMOUT by buffering the lower data mask signal LDM. That is, the lower data mask buffer 20 outputs the lower data mask buffering signal when the semiconductor device enters into test mode.

The data mask control unit 22 combines the buffering signal LDMOUT with the test mode signal TM to output a data mask control signal DM.

The data clock output unit 24 receives the data mask control signal DM and a delay locked loop clock DLL. Depending on the data mask control signal DM, the data clock output unit either outputs the delay locked loop clock DLL as a clock signal for outputting data or interrupts the delay locked loop clock DLL. Although not shown, cell data is read out by a read command, then synchronized to a rising edge or a falling edge of the clock CLK, then transferred to the data output pad via a global line, and finally output to outside the memory. The delay locked loop clock is generated by the delay locked loop circuit and is received therefrom. The delay locked loop circuit compensates for a clock delay component that occurs when the clock signal output is transferred to the data output terminal within the semiconductor memory device to generate an internal clock signal. The design of the DLL circuit is well known by a person having common knowledge in the related art and is not directly related to the present invention; accordingly, a detailed explanation of the DLL circuit has been omitted.

The upper data mask buffer 26 receives a test mode signal TM and an upper data mask signal UDM. When the test mode signal is enabled (i.e., at a high level), the upper data mask buffer 26 outputs an upper data mask buffering signal UDMOUT by buffering the upper data mask signal UDM.

The YAE control signal generating unit 28 receives the upper data mask buffering signal UDMOUT and the test mode signal TM and generates a YAE control signal DMYAE that is used for controlling the generation of the column address enable signal YAE (which is generated by the YAE generating unit 29 as is described below).

The YAE generating unit 29 receives an externally applied command COMM and, in response to the YAE control signal DMYAE, controls the generation of the column address enable signal YAE. If the YAE control signal DMYAE is enabled, the column address enable signal YAE is disabled. Therefore, a column select signal is not generated and the data stored in the cell cannot be read. That is, when the YAE control signal DMYAE is enabled, the column address enable signal YAE is disabled; and accordingly, even if a read command has been input, the data output is interrupted. The column address enable signal YAE controls the column select signal as a reference signal controlling a column address upon reading. Therefore, when the column address enable signal YAE is not generated, the data stored in the cell cannot be read normally.

Hereinafter, preferred embodiments of the data mask control unit 22, the data clock output unit 24, the YAE control signal generating unit 28, and the YAE generating unit 29 will be explained with detail.

Figure 3:
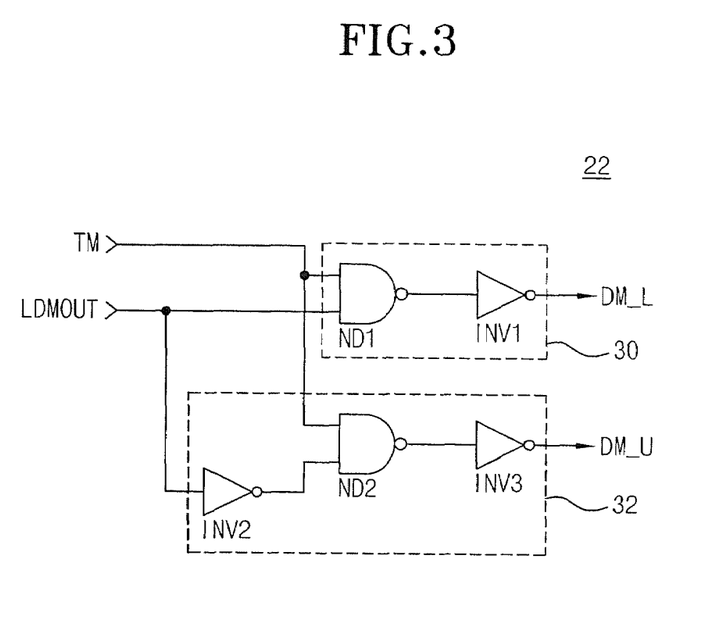
FIG. 3 is a detailed circuit diagram showing the data mask control unit of FIG. 2.

FIG. 3 is a detailed circuit diagram showing the data mask control unit 22 of FIG. 2.

Referring to FIG. 3, the data mask control unit 22 comprises a lower data mask control signal generating unit 30, which generates a lower data mask control signal DM_L for controlling the output of the lower data output pad. The lower data mask control signal DM_L is generated by combining the test mode signal TM with the lower data mask buffering signal LDMOUT. The data mask control unit 22 also comprises an upper data mask control signal generating unit 32, which generates an upper data mask control signal DM_U for controlling the output of the upper data output pad.

The lower data mask control signal generating unit 30 comprises a NAND gate NAND1, which receives and performs a NAND logical operation on the test mode signal TM and the lower data mask buffering signal LDMOUT, and an inverter INV1, which inverts the output signal of the NAND gate to output the lower data mask control signal DM_L.

The upper data mask control signal generating unit 32 comprises; an inverter INV2 receiving and inverting the lower data mask buffering signal LDMOUT, a NAND gate NAND2 receiving (as inputs) and performing a NAND logical operation on the output signal of the inverter INV2 and the test mode signal TM, and an inverter INV3 receiving and inverting the output of the NAND gate NAND2 to output the upper data mask control signal DM_U.

The operation of the mask control signal generating unit 22 will now be described. When the lower data mask buffering signal LDMOUT becomes a logical high level and after entering into test mode, the lower data mask control signal DM_L is enabled (at a high level) when the NAND gate ND1 performs a NAND logical operation on the enabled test mode signal TM and the lower data mask buffering signal LDMOUT and the inverter INV2 inverts the output of the NAND gate ND1. When the lower data mask buffering signal LDMOUT becomes a logical low level and after entering into the test mode, the inverter INV2, inverts the lower data mask buffering signal LDMOUT to output a high level signal, and therefore the upper mask control DM_U is enabled (at a high level) since the NAND gate ND2 performs a NAND logical operation on the high level signal from the inverter INV2 and the enabled test mode signal TM and the output of the NAND gate ND2 is inverted by the inverter INV3.

Figure 4:
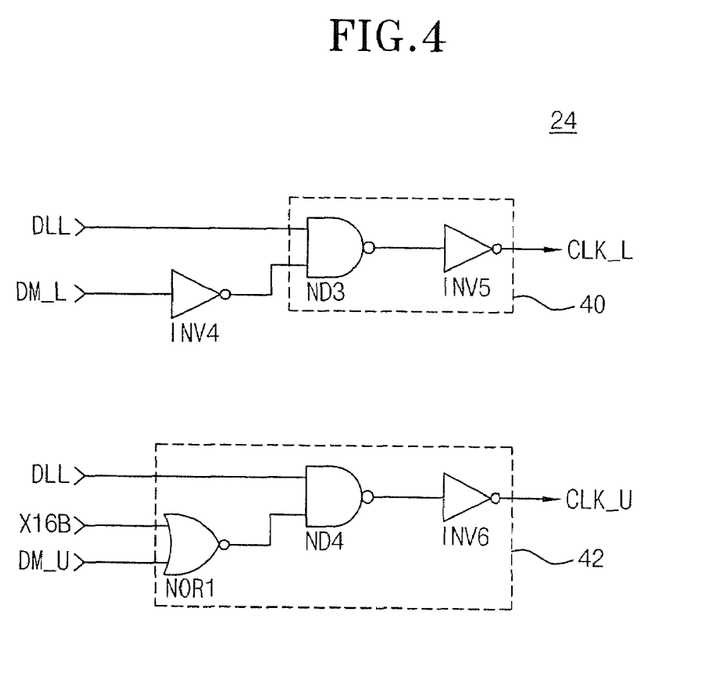
FIG. 4 is a detailed circuit diagram showing the data clock output unit of FIG. 2.

FIG. 4 is a detailed circuit diagram showing the data clock output unit 24 of FIG. 2.

Referring to FIG. 4, the data clock output unit 24: comprises a lower clock output unit 40, which receives the delay locked loop clock DLL output from the delay locked loop circuit (not shown) and outputs a lower clock CLK_L in response to the lower data mask control signal DM_L; and an upper clock output unit 42, which receives the delay locked loop clock DLL and outputs an upper clock CLK_U in response to the upper data mask control signal DM_U.

The lower clock output unit 40 comprises: an inverter IN4 which receives and inverts the phase of the lower data mask control signal DM_L; a NAND gate ND3 receiving and performing a NAND logical operation on the signal output from the inverter INV4 and the delay locked loop clock DLL, and an inverter INV5 inverting the output of the NAND gate ND3.

The upper clock output unit 42 comprises: a NOR gate NOR1 receiving and performing a NOR logical operation on a mode select signal X16B and an upper mask control signal DM_U; a NAND gate ND4 receiving and performing a NAND logical operation on the output signal of the NOR gate NOR1 and the delay locked loop clock DLL; and an inverter INV6 inverting the output of the NAND gate ND4. The upper clock output unit 42 can also use an inverter (as is done in the upper clock output unit 40) instead of the NOR gate NOR1. In the embodiment shown in FIG. 4, the NOR gate NOR1 receives a mode select signal X16B, which represents whether or not the semiconductor device is in X16 mode, since there may be no need to use the upper data pin when operating in X8 mode. Accordingly, in X4/X8 operation modes, the mode select signal X16B becomes a high level to turn off the upper data output pad.

The lower clock output unit 40 also comprises: a rising clock output unit, which outputs a rising clock so that a rising DLL clock is input to the NAND gate ND3; and a falling clock output unit, which outputs a failing clock so that a falling DLL clock is input to the NAND gate ND3. A detailed circuit diagram is omitted, as they have substantially the same structure except, of course, for the input signal. The upper clock output unit 42 also comprises: a rising clock output unit, which outputs a rising clock so that the rising DLL clock is input to the NAND gate ND4; and a falling clock output unit, which outputs a falling clock so that the failing DLL clock is input to the NAND gate ND4.

The operation of the data clock output unit 24 will now be described. If the lower data mask control signal is enabled, the enabled signal is then inverted by the inverter INV4 and is inputted to the NAND gate ND3, and thus the lower clock CLK_L becomes disabled. That is, both the lower rising clock and the lower falling clock are disabled, and thus data is not output via the lower data pad. At this time, the upper data mask control signal DM_U is disabled, and therefore the output of the NOR gate NOR1 becomes a high level as long as the mode select signal X16B is a low level. Therefore, the delay locked loop clock DLL is normally output as an upper clock signal CLK_U via the NAND gate ND4 and the inverter INV6.

On the other hand, when the upper data mask control signal DM_L is disabled and the upper data mask control signal DM_U is enabled, the lower clock signal CLK_L is output as a normal clock signal, and the upper clock signal CLK_U is disabled by the upper mask control signal DM_U.

Accordingly, it is possible to control the upper data output pad and the lower data output pad simultaneously using only the lower data mask signal LDM.

Figure 5:
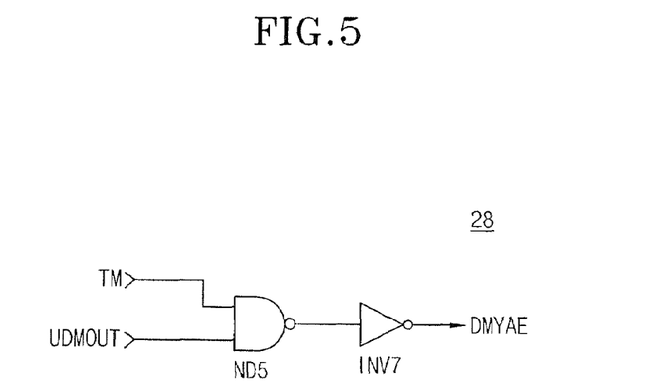
FIG. 5 is a detailed circuit diagram showing the YAE control signal generating unit of FIG. 2.

FIG. 5 is a detailed circuit diagram showing the YAE control signal generating unit 28 of FIG. 2.

Referring to FIG. 5, the YAE control signal generating unit 28 comprises: a NAND gate ND5 receiving and performing a NAND logical operation on the upper data mask buffering signal UDMOUT and the test mode signal TM; and an inverter INV7 inverting the output of the NAND gate ND5 to output the YAE control signal DMYAE.

In the embodiment shown in FIG. 5, the YAE control signal DMYAE is enabled when the upper data mask buffering signal UDMOUT and the test mode signal TM are both enabled (at a high level).

Figure 6:
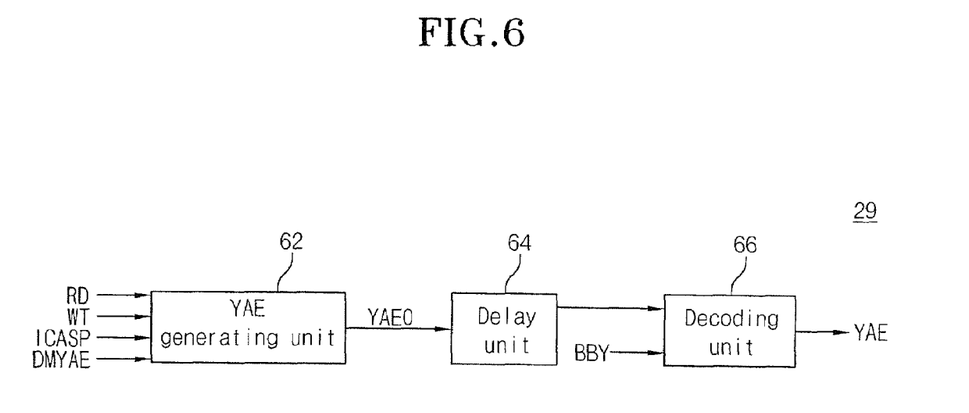
FIG. 6 is a detailed block diagram showing the YAE generating unit of FIG. 2.

FIG. 6 is a detailed block diagram showing one embodiment of the YAE generating unit 29 of FIG. 2.

Referring to FIG. 6, the YAE generating unit 29 comprises: a YAE generating unit 62, which receives a read command signal RD, a write command signal WT, a column access strobe (CAS) signal ICASP, and the YAE control signal DMYAE and generates a column address enable signal YAE0; a delay unit 64, which receives the column address enable signal YAE0 and delays the signal for a certain time; and a decoding unit 66 which receives a bank signal BBY and the delayed column address enable signal YAE0 and outputs a column address enable signal YAE to a bank that is selected by decoding the delayed signal. The YAE generating unit 62 disables the column address enable signal YAE0 when the YAE control signal DMYAE is enabled. Therefore, if the YAE control signal DMYAE is enabled, the column select signal is not generated normally, and thus the data of the corresponding cell cannot be read even though the read command has been input, thereby preventing the data from being output.

The YAE generating unit 29 can have various configurations in addition to the embodiment shown in FIG. 6.

For example, the YAE generating unit 29 can be configured to disable the column address enable signal YAE0 when the YAE control signal DMYAE is enabled by arranging a logic circuit, such as a NOR gate, such that the NOR gate receives the YAE control signal DMYAE and the column address enable signal YAE0 as inputs at the rear end portion of the YAE generating unit.

Figure 7:
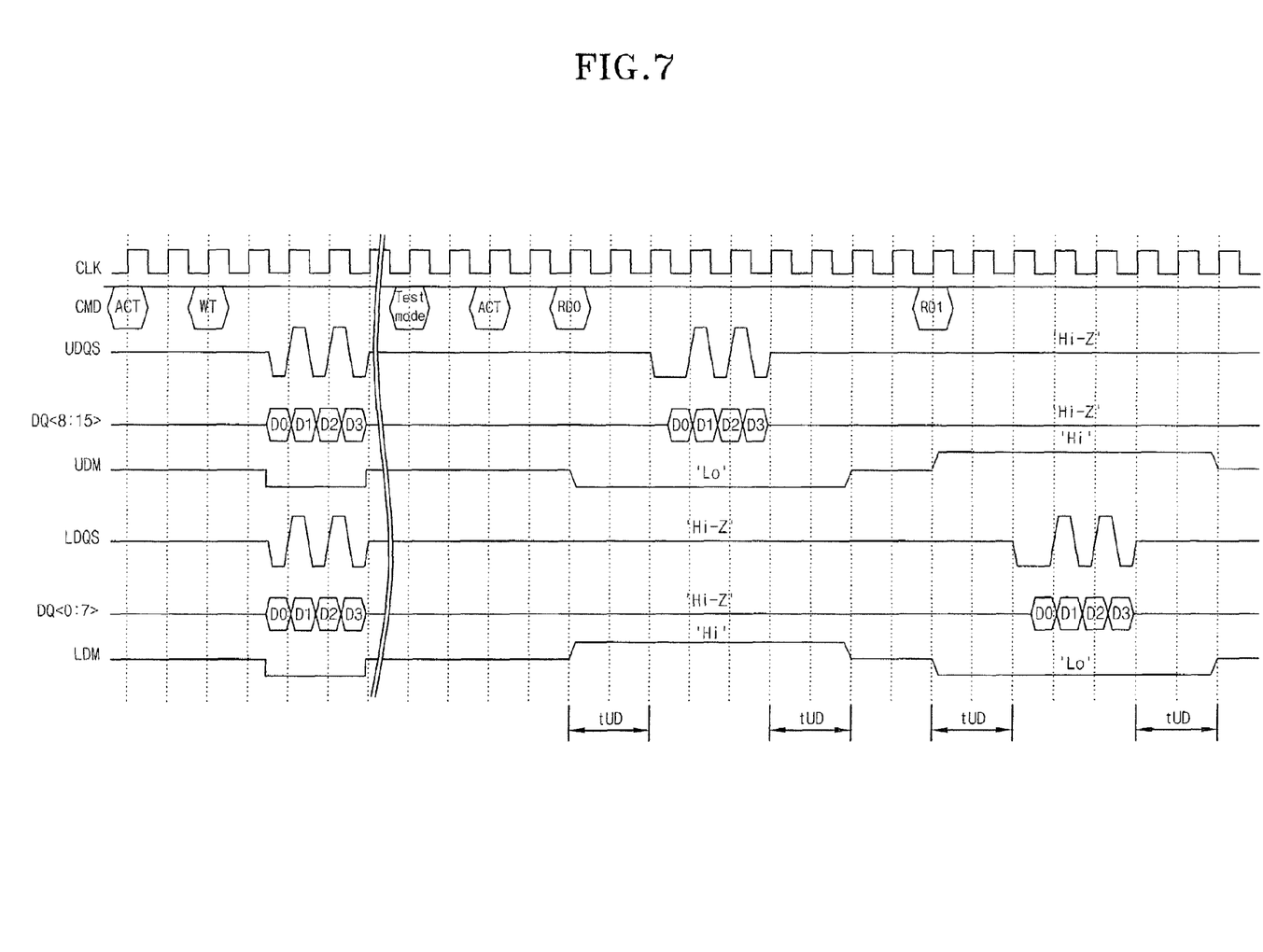
FIG. 7 is an operational timing diagram illustrating the operation of the semiconductor device according to the present invention.

FIG. 7 is an operational timing diagram of the semiconductor device according to the present invention.

Referring to FIG. 7, the write operation is the same as a normal operation, except that the write operation must write the same data to the lower data block<0:7> and the upper data block<8:15>.

The read operation is performed twice after the test mode has been entered into. The first read command RD0 is applied before a preamble time tUD. The tUD refers to a timing margin for the upper data mask signal UDM and the lower data mask signal LDM to turn off the internal signal. The timing margin depends on process, voltage ambient temperature, and the like.

When the first read command RD0 is applied, the lower data mask signal LDM is enabled (a logical high level). Therefore, the output of the lower data output pad DQ<0:7> is interrupted, and data is output only via the upper data output pad DQ<8:15>. Referring again to FIG. 2 and FIG. 3, if the lower data mask signal LDM is enabled, the lower data mask control signal DM_L is also enabled, and therefore the output from the lower data pad DQ<0:7> is interrupted and the lower data pad is at a high impedance state "Hi-Z". At this time, the upper data mask control signal DM_U is disabled so that data is output via the upper data output pad DQ<8:15>. When the upper data mask signal UDM is disabled, the column address enable signal YAE is generated normally, thereby accessing the data cell normally. Therefore, cell data is transferred into the data pad via the global input/output line and output to outside the memory after the read command RD0 is input. At this time, if the lower data mask signal LDM is enabled, the output of the lower data output pad DQ<0:7> is interrupted and the upper data output pad DQ<8:15> is enabled.

When the second read command RD1 is applied, the lower data mask signal LDM is disabled (a logical low level). Therefore, the lower data output pad DQ<0:7> outputs the data, and the output from the upper data output pad DQ<8:15> is interrupted. Referring again to FIG. 2 and FIG. 3, it can be appreciated that the lower data mask control signal DM_L is disabled when the lower data mask signal LDM is disabled. Further, the upper data mask control signal DM_U is enabled, so that the output from the upper data output pad<8:15> is interrupted, and the upper data output pad is at a high impedance state "Hi-Z". At this time, when the upper data mask signal UDM is enabled, the column address enable signal YAE is disabled to cause the data cell not to be accessed. Therefore, the data stored on the data cell is not read when the second read command RD1 is applied, but it is, however, read and latched when the first read command RD0 is applied so that the data latched in the global input/output line is output.

More specifically, if the second read command is inputted, the data read by the first read command and latched in the global input/output line is output without reading the data in the cell again. Therefore, the present invention addresses the problem wherein a failure decision at a first read time disappears at the second read time.

The test mode signal does not necessarily need to be generated after the write command, and can be enabled after a power-up and before the active operation. Further, the lower data mask signal LDM and the upper data mask signal UDM can be operated by changing their sequence for the purpose of testing and screenability.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor device receiving a first data mask signal and a second data mask signal, the semiconductor device comprising:
    a data mask control unit outputting a data mask control signal by combining a test mode signal with the first data mask signal;
    a data clock output unit receiving a clock signal and outputting a data clock in response to the data mask control signal; and
    a column address enable (YAE) control signal generating unit generating a column address enable control signal by combining the test mode signal with the second data mask signal, wherein the column address enable control signal controls the enablement of a column address enable signal.

2. The semiconductor device as set forth in claim 1, further comprising a YAE generating unit receiving the column address enable control signal, wherein the YAE generating unit disables the column address enable signal when the column address enable control signal is enabled such that a column select signal is not generated and data stored in a corresponding memory cell cannot be read.

3. The semiconductor device as set forth in claim 1, wherein the first data mask signal is a lower data mask signal and the second data mask signal is an upper data mask signal.

4. The semiconductor device as set forth in claim 1, wherein the data mask control signal output from the data mask control unit comprises:
a first data mask control signal causing interruption of an output of a first data pad for outputting a first bit data when the test mode signal and the first data mask signal are enabled; and
a second data mask control signal causing interruption of an output of a second data pad for outputting a second bit data when the test mode signal is enabled and the first data mask signal is disabled,
wherein the first data pad and the second data pad are controlled simultaneously using the data mask control signal.

5. The semiconductor device as set forth in claim 4, wherein the first data pad is a lower data pad outputting lower bit data to outside of the semiconductor device, and the second data pad is an upper data pad outputting upper bit data to outside the semiconductor device.

6. The semiconductor device as set forth in claim 5, wherein the data clock output from the data clock output unit comprises:
a first data clock unit receiving the first data mask control signal, wherein the first data clock is disabled when the first data mask control signal is enabled; and
a second data clock unit receiving the second data mask control signal, wherein the second data clock is disabled when the second data mask control signal is enabled.

7. The semiconductor device as set forth in claim 6, wherein the data clock output unit also receives a mode select signal that is enabled in X4 or X8 operation modes, and the second data clock is disabled when the mode select signal is enabled.

8. The semiconductor device as set forth in claim 6, wherein the first data clock is a lower data clock that is generated by a lower data clock output unit and that controls the output of the lower data pad, and the second data clock is an upper data clock that is generated by an upper data clock output unit and that controls the output of the upper data pad.

9. The semiconductor device as set forth in claim 1, wherein after the test mode is enabled, the first data mask signal mode is enabled when a first read command is applied, and the second data mask signal is enabled when a second read command is applied.

10. The semiconductor device as set forth in claim 9, wherein the column address enable control signal is enabled when the second data mask signal is enabled.

11. The semiconductor device as set forth in claim 1, wherein the clock signal is a delay locked loop clock generated by a delay locked loop circuit.

12. A semiconductor device, comprising:
first and second data pads which read cell data by causing a column address enable signal to be activated when a data read command is applied, wherein the first and second data pads output the read data to outside of a memory, and wherein the output of the read data of one of the first and second data pads is interrupted in response to a first data mask signal;
a data mask control unit simultaneously controlling the outputs of the first and second data pads in response to the first data mask signal; and
a YAE control signal generating unit generating a column address enable control signal that controls generation of the column address enable signal in response to a second data mask signal.

13. The semiconductor device as set forth in claim 12, wherein the data mask control unit interrupts the output of the first data pad and outputs the data via the second data pad when the first data mask signal is enabled.

14. The semiconductor device as set forth in claim 12, wherein the data mask control unit outputs the data via the first data pad and interrupts an output from the second data pad when the first data mask signal is disabled.

15. The semiconductor device as set forth in claim 12, wherein the YAE control signal generating unit disables the column address enable signal when the second data mask signal is enabled.

16. The semiconductor device as set forth in claim 12, wherein after a test mode is entered into, the second data mask signal is disabled when a first read command is applied and is enabled when a second read command is applied.

17. The semiconductor device as set forth in claim 16, wherein the YAE control signal generating unit generates a YAE control signal which is enabled when the second data mask signal is enabled.

18. The semiconductor device as set forth in claim 12, wherein the first data mask signal is a lower data mask signal and the second data mask signal is an upper data mask signal.

19. A data output method of a semiconductor device, comprising the steps of:
applying a first read command after a test mode is entered into;
reading data of a memory cell in response to the first read command to transmit the read data to first and second data output pads;
enabling a first data mask signal to cause the first data output pad to be interrupted when the first read command is applied, such that the first data output pad does not output the read data;
disabling a column address enable signal in response to a second data mask signal when a second read command is applied such that data of the memory cell is not read again; and
disabling the first data mask signal after the second read command to cause the second data output pad to be interrupted.

20. The data output method as set forth in claim 19, further comprising the step of outputting the transmitted data via the second data output pad after interrupting the first data output pad.

21. The data output method as set forth in claim 19, further comprising the steps of outputting the transmitted data via the first data output pad after interrupting the second data output pad, and outputting the transmitted data via the second data output pad after interrupting the first data output pad.

22. The data output method as set forth in claim 19, wherein the first data output pad is a lower data output pad and the second data output pad is an upper data output pad.

23. The data output method as set forth in claim 19, wherein the first data mask signal is a lower data mask signal and the second data mask signal is an upper data mask signal.

24. The data output method as set forth in claim 19, wherein the second data mask signal is disabled when the first read command is applied and enabled when the second read command is applied.

* * * * *